(12) United States Patent
Wang

(10) Patent No.: US 11,748,282 B2
(45) Date of Patent: Sep. 5, 2023

(54) ELECTRONIC DEVICE

(71) Applicant: ALi Corporation, Hsinchu (TW)

(72) Inventor: Shyh-Hsing Wang, Taipei (TW)

(73) Assignee: ALi Corporation, Hsinchu (TW)

( * ) Notice: Subject to any disclaimer, the term of this patent is extended or adjusted under 35 U.S.C. 154(b) by 0 days.

(21) Appl. No.: 17/543,651

(22) Filed: Dec. 6, 2021

(65) Prior Publication Data

US 2022/0197839 A1    Jun. 23, 2022

(30) Foreign Application Priority Data

Dec. 22, 2020 (CN) .......................... 202011528307.0

(51) Int. Cl.
| | | |
|---|---|---|
| G06F 13/16 | (2006.01) | |
| G06F 13/20 | (2006.01) | |
| G06F 1/06 | (2006.01) | |
| G06F 13/40 | (2006.01) | |

(52) U.S. Cl.
CPC .............. *G06F 13/20* (2013.01); *G06F 1/06* (2013.01); *G06F 13/1673* (2013.01); *G06F 13/4068* (2013.01)

(58) Field of Classification Search
None
See application file for complete search history.

(56) References Cited

U.S. PATENT DOCUMENTS

| | | | | |
|---|---|---|---|---|
| 7,256,778 B1* | 8/2007 | Choi | ...................... | H03K 17/16 |
| | | | | 327/143 |
| 7,305,058 B1* | 12/2007 | Venkata | .................... | H04L 7/02 |
| | | | | 713/400 |
| 8,020,024 B2* | 9/2011 | Chen | ......................... | G06F 1/24 |
| | | | | 360/323 |
| 8,067,952 B2 | 11/2011 | Ker et al. | | |
| 11,054,853 B2* | 7/2021 | Sasahara | .................... | G06F 1/06 |
| 2005/0036577 A1* | 2/2005 | Sweet | ................ | H04N 21/4263 |
| | | | | 348/E5.002 |
| 2006/0044715 A1 | 3/2006 | Muggler et al. | | |
| 2014/0292370 A1* | 10/2014 | Harman | ............... | H03K 19/003 |
| | | | | 326/93 |
| 2015/0364177 A1* | 12/2015 | Lee | ...................... | G11C 7/1084 |
| | | | | 365/222 |

\* cited by examiner

*Primary Examiner* — Elias Mamo
(74) *Attorney, Agent, or Firm* — JCIPRNET

(57) ABSTRACT

An electronic device includes a core circuit and a detecting circuit. The core circuit receives a first clock signal and a second clock signal that are different. The core circuit generates a first working state and a second working state respectively according to the first clock signal and the second clock signal. The detecting circuit detects a relationship between the first working state and the second working state to generate a reset signal. The reset signal is configured to reset the relationship between the first working state and the second working state to an initial corresponding relationship, and reduce an influence of electromagnetic interference on the electronic device.

10 Claims, 5 Drawing Sheets

ELECTRONIC DEVICE

CROSS-REFERENCE TO RELATED APPLICATION

This application claims the priority benefit of Chinese application no. 202011528307.0, filed on Dec. 22, 2020. The entirety of the above-mentioned patent application is hereby incorporated by reference herein and made a part of this specification.

BACKGROUND

Technical Field

The disclosure relates to an electronic device; particularly, the disclosure relates to an electronic device that overcomes malfunction caused by electromagnetic interference.

Description of Related Art

In current integrated circuit designs, it is often required to configure many different internal clock domains inside, so there are many cross clock processing mechanisms, such as an asynchronous buffer circuit. When the asynchronous buffer circuit receives clock signals from different clock sources but at the same frequency, it may perform a read and a write. When the data stream is continuous (e.g., image data), this buffer circuit continuously writes data and reads data, maintains a relationship between read/write points, and continuously outputs data.

When electromagnetic interference is generated in the integrated circuit due to electrostatic discharge or an external force, clock signals of different clocks may include different variations, such as frequency drift, due to different degrees of tolerance to interference. The variations of the clock signal may cause damage to the relationship between the read and write operations of the buffer circuit, and may cause errors in the output data.

SUMMARY

The disclosure relates to an electronic device that avoids malfunction due to electromagnetic interference.

According to an embodiment of the disclosure, an electronic device includes a core circuit and a detecting circuit. The core circuit receives a first clock signal and a second clock signal that are different. The core circuit generates a first working state and a second working state respectively according to the first clock signal and the second clock signal. The detecting circuit is coupled to the core circuit. The detecting circuit detects a relationship between the first working state and the second working state to generate a reset signal. The reset signal is configured to reset the relationship between the first working state and the second working state to an initial corresponding relationship.

Based on the foregoing, in the embodiment of the disclosure, the electronic device may perform the different operations and have the different working states respectively according to the different clock signals. Also, in the disclosure, when the relationship between the working states is varied due to electromagnetic interference, the electronic device may also provide the reset signal to restore the relationship between the working states to the normal initial corresponding relationship. In this way, malfunction of the electronic device due to electromagnetic interference is prevented.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
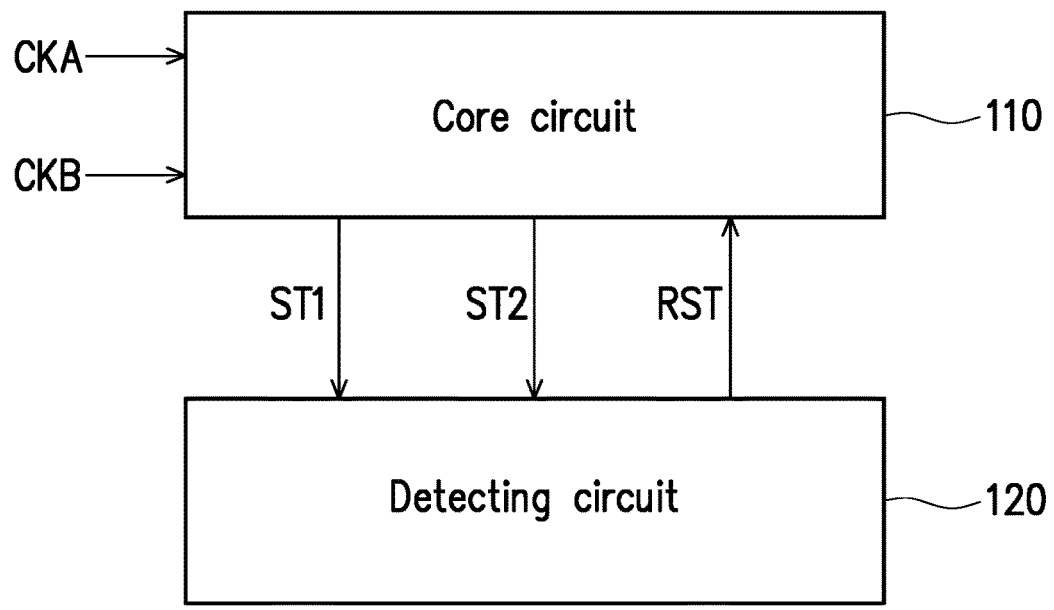
FIG. 1 is a schematic diagram showing an electronic device according to an embodiment of the disclosure.

Reference will now be made in detail to exemplary embodiments of the disclosure, examples of which are illustrated in the accompanying drawings. Wherever possible, the same reference numerals are used in the drawings and descriptions to refer to the same or similar parts.

With reference to FIG. 1, which is a schematic diagram showing an electronic device according to an embodiment of the disclosure, an electronic device 100 includes a core circuit 110 and a detecting circuit 120. The core circuit 110 receives a clock signal CKA and a clock signal CKB that are different. The core circuit 110 generates a working state ST1 and a working state ST2 respectively according to the clock signal CKA and the clock signal CKB. The detecting circuit 120 is coupled to the core circuit 110. The detecting circuit 120 detects a relationship between the working state ST1 and the working state ST2 to generate a reset signal RST. In this embodiment, the core circuit 110 performs two different tasks respectively according to the clock signal CKA and the clock signal CKB. In addition, the two different tasks corresponding to the clock signal CKA and the clock signal CKB may respectively have the working state ST1 and the working state ST2. In a normal case, an initial corresponding relationship is predetermined between the working state ST1 and the working state ST2 in the core circuit 110. In practical applications, as the electronic device 100 operates, a certain degree of frequency drift in any of the clock signal CKA and the clock signal CKB may be caused by electromagnetic interference generated due to electrostatic discharge, for example. This frequency drift may cause errors in at least one of the working state ST1 and the working state ST2, cause the relationship between the working state ST1 and the working state ST2 to differ from the initial corresponding relationship, and cause malfunction of the core circuit 110.

In this embodiment, the clock signal CKA and the clock signal CKB may come from different clock sources.

In this embodiment, when the detecting circuit 120 determines that the relationship between the working state ST1 and the working state ST2 is not the same as the initial corresponding relationship, it may correspondingly generate the reset signal RST. The reset signal RST may be transmitted to the core circuit 110, so that the core circuit 110 resets the relationship between the working state ST1 and the working state ST2 to the initial corresponding relationship. In this way, the core circuit 110 returns to normal function and decreases the possibility of malfunction. Besides, when the detecting circuit 120 determines that the relationship between the working state ST1 and the working state ST2 is the same as the initial corresponding relationship, the core circuit 110 is maintained in normal function.

Figure 2A:
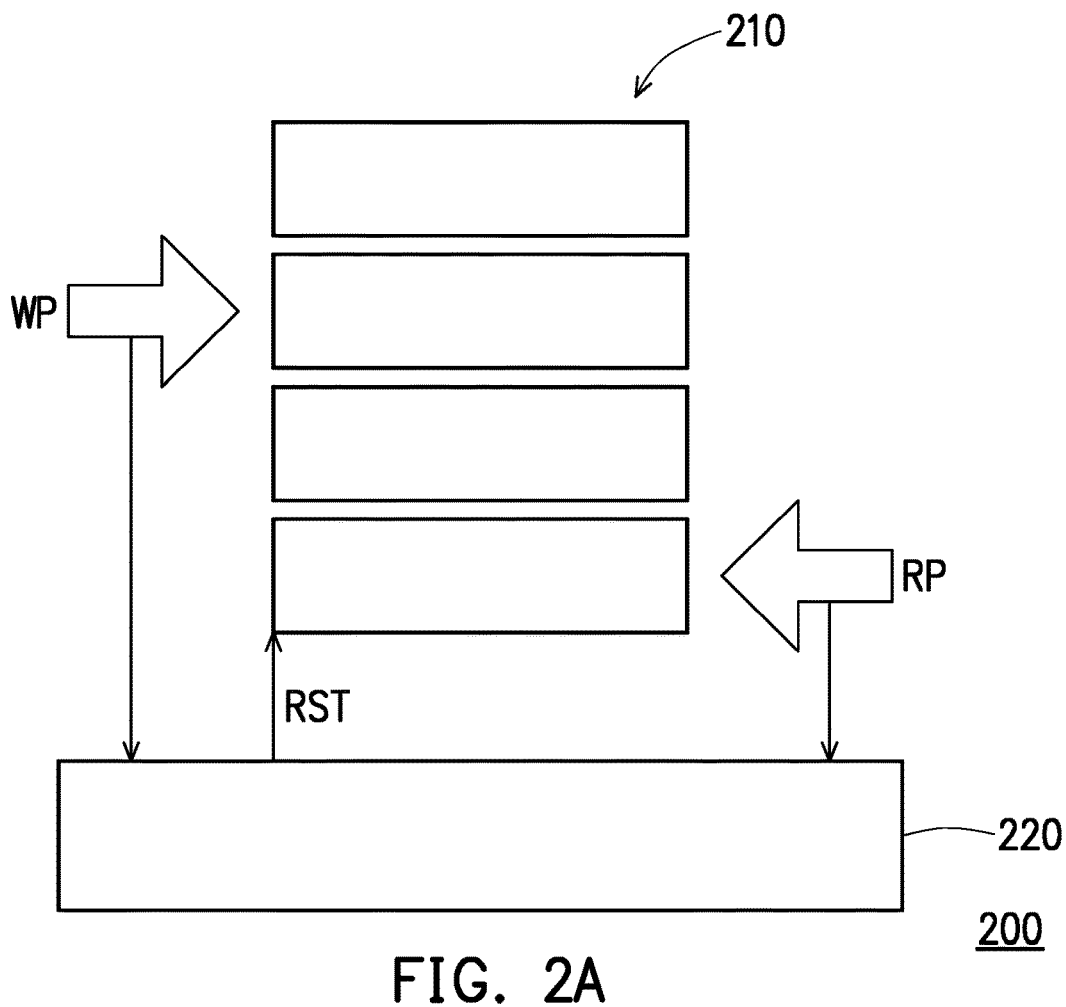
FIG. 2A is a schematic diagram showing an electronic device according to another embodiment of the disclosure.

Hereinafter, reference may be made to FIG. 2A, which is a schematic diagram showing an electronic device according to another embodiment of the disclosure. An electronic device 200 includes a data buffer 210 as a core circuit and a detecting circuit 220. The data buffer 210 obtains a data write point WP and a data read point RP respectively according to the clock signal CKA and the clock signal CKB. The data buffer 210 may perform data write according to the data write point WP, and the data buffer 210 may perform data read according to the data read point RP. The data write point WP may correspond to a first physical address of the data buffer 210, and the data read point RP may correspond to a second physical address of the data buffer 210. The first physical address and the second physical address may be the same or different. Moreover, the data write and data read of the data buffer 210 may be performed at the same time.

In this embodiment, the data write point WP and the data read point RP may serve as two working states corresponding to the clock signals CKA and CKB in the data buffer 210.

In a normal case, the first physical address and the second physical address respectively corresponding to the data write point WP and the data read point RP cannot be the same. The reason is that when the data write point WP and the data read point RP correspond to the same physical address, it is possible that the data that is read from the operation of data read cannot be distinguished from old data and newly written data, and even that the old and new data may be read mixedly.

In this embodiment, in a normal case, an initial corresponding relationship is present between the data write point WP and the data read point RP. During operation of the electronic device 200, the detecting circuit 220 may receive information related to the data write point WP and the data read point RP, and detect whether the initial corresponding relationship is maintained between the data write point WP and the data read point RP. In this embodiment, such initial corresponding relationship may be a difference value between the first physical address and the second physical address respectively corresponding to the data write point WP and the data read point RP. For example, in order to stably perform the read and write operations, the address difference value between the first physical address corresponding to the data write point WP and the second physical address corresponding to the data read point RP may be set to a predetermined standard value.

Figure 2B:
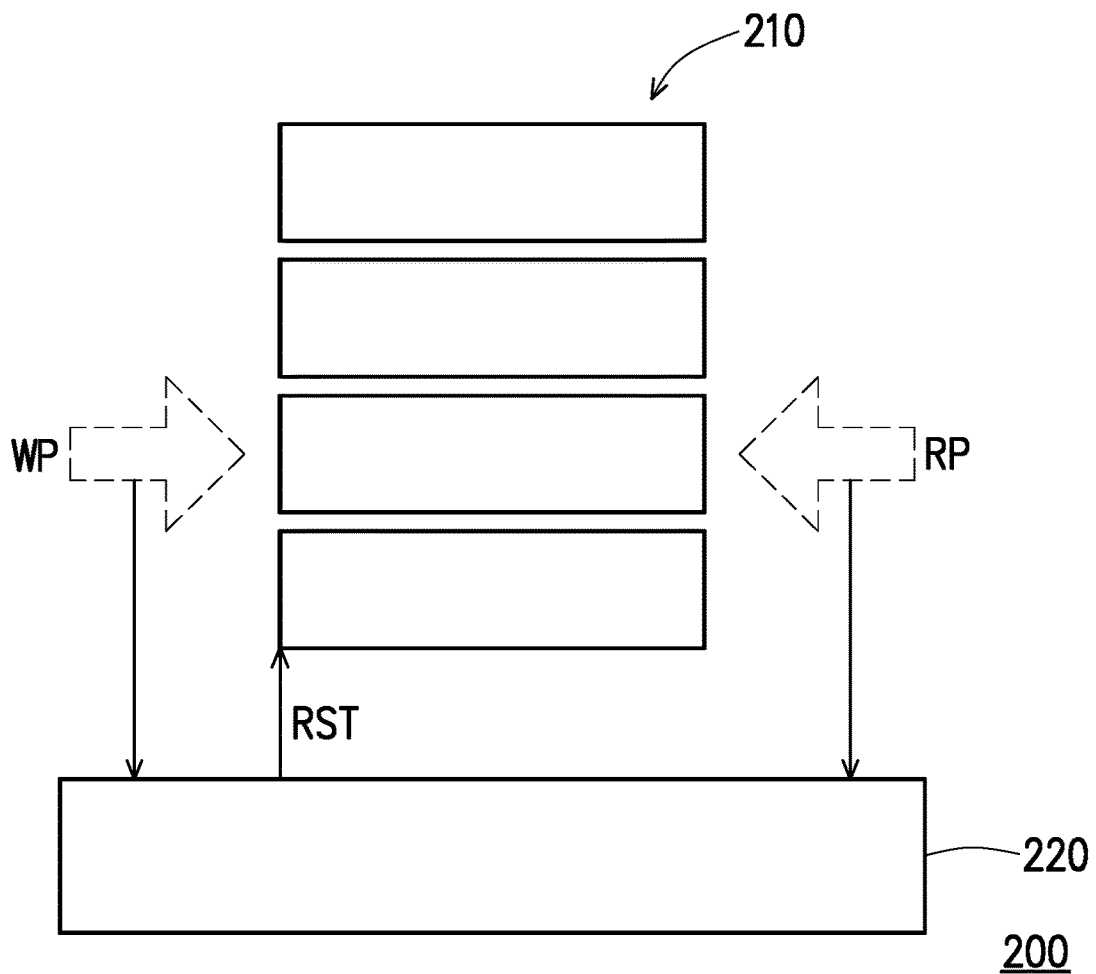
FIG. 2B is a schematic diagram showing the electronic device operating according to the embodiment of FIG. 2A of the disclosure.

Hereinafter, reference may be made to FIG. 2B, which shows the electronic device operating according to the embodiment of FIG. 2A of the disclosure. When the electronic device 200 is affected by electromagnetic interference, the first physical address and the second physical address corresponding to the data write point WP and the data read point RP are changed to be the same. In this way, the detecting circuit 220 detects that the address difference value between the first physical address and the second physical address is 0 (different from the predetermined standard value), and accordingly identifies that the relationship between the data write point WP and the data read point RP is different from the initial corresponding relationship. At the same time, the detecting circuit 220 may generate the reset signal RST, so that the data write point WP and the data read point RP are reset and restored to the state with the initial corresponding relationship.

In this way, through detecting whether the address difference value is changed and generating the reset signal RST when the address difference value is changed, the detecting circuit 220 restores the address difference value between the first physical address and the second physical address, maintaining the data buffer 210 in normal function of the read and write operations.

Figure 3:
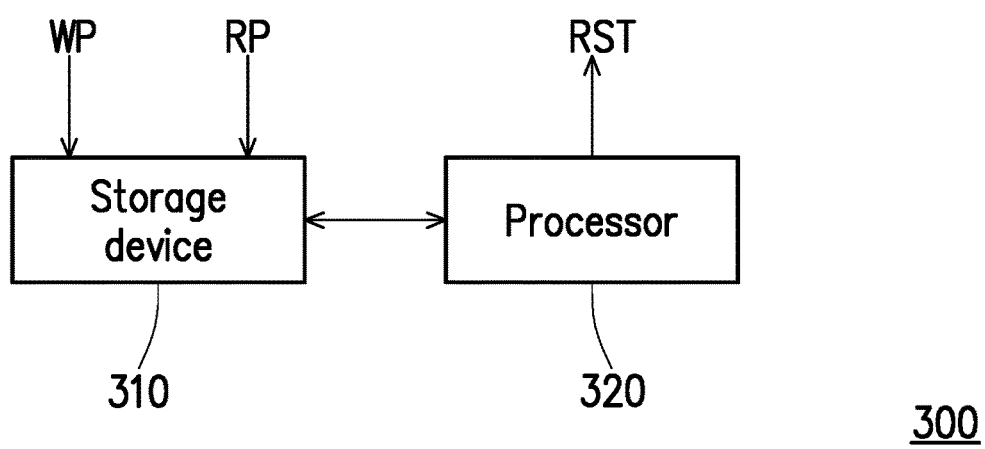
FIG. 3 is a schematic diagram showing an implementation of a detecting circuit according to an embodiment of the disclosure.

Hereinafter, reference may be made to FIG. 3, which is a schematic diagram showing an implementation of a detecting circuit according to an embodiment of the disclosure. A detecting circuit 300 may be configured to implement the detecting circuit 220 of FIG. 2A and FIG. 2B. The detecting circuit 300 includes a storage device 310 and a processor 320. The storage device 310 may be configured to store the predetermined standard value. The storage device 310 may receive the data write point WP and the data read point RP from the core circuit. The processor 320 receives the predetermined standard value, the data write point WP, and the data read point RP. The processor 320 obtains the first physical address and the second physical address respectively corresponding to the data write point WP and the data read point RP, and determines whether the address difference value between the first physical address and the second physical address is equal to the predetermined standard value to generate the reset signal RST.

In terms of hardware architecture, the storage device 310 may be a storage device in any form. The processor 320 may be a processor with a computing capability. Alternatively, the processor 320 may be a hardware circuit designed through a hardware description language (HDL) or any other digital circuit design familiar to those having common knowledge in the related art, and implemented through a field programmable gate array (FPGA), a complex programmable logic device (CPLD), or an application-specific integrated circuit (ASIC).

Hereinafter, reference may be made to FIG. 4A, which is a schematic diagram showing an electronic device according to another embodiment of the disclosure. An electronic device 400 includes a first state machine circuit 410, a second state machine circuit 420, and a detecting circuit 430. The first state machine circuit 410 and the second state machine circuit 420 may be core circuits, and respectively receive the clock signals CKA and CKB to perform tasks. Herein, the first state machine circuit 410 may operate in a working state STATEA according to the clock signal CKA. At the same time, the second state machine circuit 420 may operate in a working state STATEB according to the clock signal CKB.

The detecting circuit 430 is coupled to the first state machine circuit 410 and the second state machine circuit 420. The detecting circuit 430 detects whether a relationship between the working state STATEA of the first state machine circuit 410 and the working state STATEB of the second state machine circuit 420 at a same time point matches an initial corresponding relationship to generate the reset signal RST. When the relationship between the working state STATEA of the first state machine circuit 410 and the working state STATEB of the second state machine circuit 420 is not the initial corresponding relationship, the detecting circuit 430 may generate the reset signal RST, so that the first state machine circuit 410 and the second state machine circuit 420 perform a reset operation, and the relationship between the working state STATEA of the first state machine circuit 410 and the working state STATEB of the second state machine circuit 420 is restored to the initial corresponding relationship. On the contrary, when the relationship between the working state STATEA of the first state machine circuit 410 and the working state STATEB of the second state machine circuit 420 is maintained equal to the initial corresponding relationship, the first state machine circuit 410 and the second state machine circuit 420 are maintained in normal function.

Figure 4A:
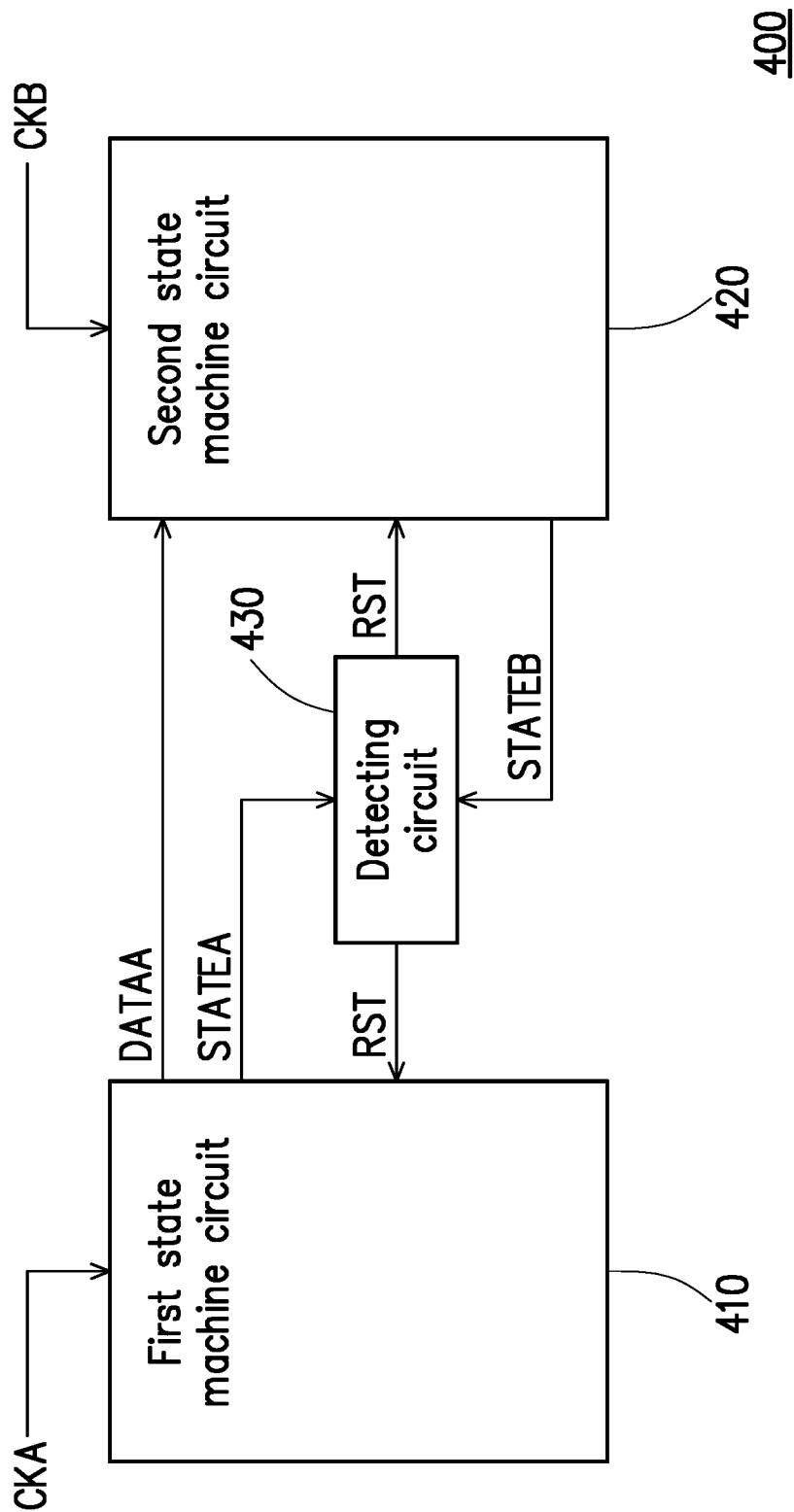
FIG. 4A is a schematic diagram showing an electronic device according to another embodiment of the disclosure.
Figure 4B:
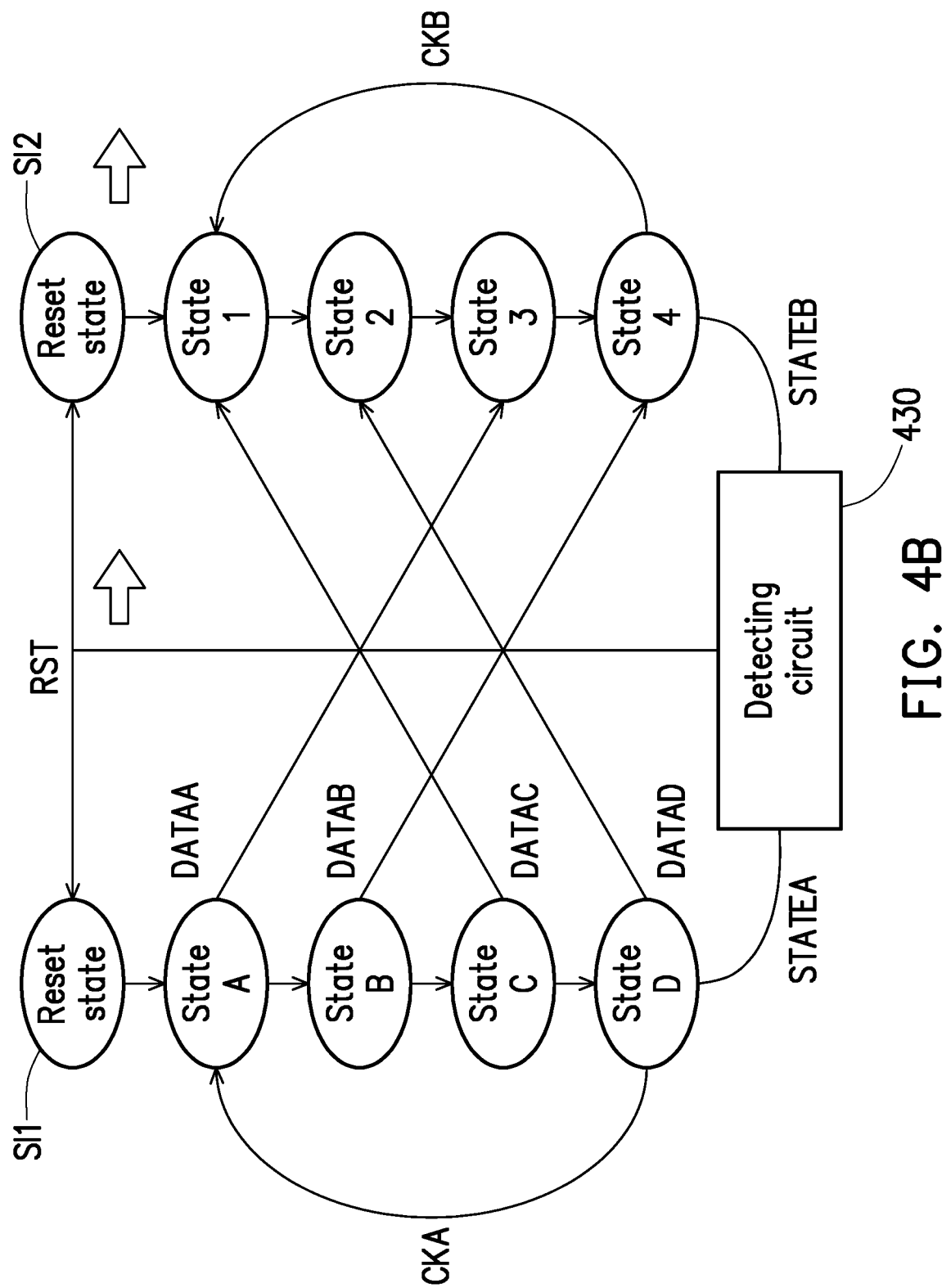
FIG. 4B is a schematic diagram showing details of the electronic device operating according to the embodiment of FIG. 4A of the disclosure.

For implementation details of the electronic device 400 in the embodiment of FIG. 4A, reference may be made to FIG. 4B, which is a schematic diagram showing details of the electronic device operating according to the embodiment of FIG. 4A of the disclosure. Herein, the first state machine circuit 410 and the second state machine circuit 420 are activated from reset states SI1 and SI2 according to the reset signal RST. The first state machine circuit 410 sequentially and cyclically operates from a state A to a state D according to the clock signal CKA. The second state machine circuit 420 sequentially and cyclically operates from a state 1 to a state 4 according to the clock signal CKB.

The following operation details are in a normal case based on the clock signals CKA and CKB. In the state A, the first state machine circuit 410 may perform data write of data DATAA on a register corresponding to the state 3 in the second state machine circuit 420, and in the state 1, the second state machine circuit 420 reads data stored in a register corresponding to the state 1 (data read). In the state B, the first state machine circuit 410 may perform data write of data DATAB on a register corresponding to the state 4 in the second state machine circuit 420, and in the state 2, the second state machine circuit 420 reads data stored in a register corresponding to the state 2 (data read). In the state C, the first state machine circuit 410 may perform data write of data DATAC on the register corresponding to the state 1 in the second state machine circuit 420, and in the state 3, the second state machine circuit 420 reads data stored in the register corresponding to the state 3 (data read). Furthermore, in the state D, the first state machine circuit 410 may perform data write of data DATAD on the register corresponding to the state 2 in the second state machine circuit 420, and in the state 4, the second state machine circuit 420 reads data stored in the register corresponding to the state 4 (data read).

According to the above, in the normal case, the first state machine circuit 410 and the second state machine circuit 420 are maintained to perform the data read and write operations on different registers, instead of generating a read-write conflict.

When electromagnetic interference generated due to electrostatic discharge or other external forces occurs, the clock signals CKA and CKB may be varied, causing the relationship between the working states of the first state machine circuit 410 and the second state machine circuit 420 to be varied. At this time, the detecting circuit 430 may generate the reset signal RST through detecting whether the relationship between the working states STATEA and the STATEB is maintained the same as the initial corresponding relationship. Moreover, when the relationship between the working states STATEA and STATEB is different from the initial corresponding relationship, the detecting circuit 430 may enable the reset signal RST, so that the first state machine circuit 410 and the second state machine circuit 420 are reset to the reset states SI1 and SI2, and return to normal function respectively based on the clock signals CKA and CKB.

Notably, in FIG. 4B, the first state machine circuit 410 may additionally include one or more states other than the state A to the state D. Similarly, the second state machine circuit 420 may also include one or more states other than the state 1 to the state 4. In FIG. 4B, the number of states of each of the first state machine circuit 410 and the second state machine circuit 420 only serves for conveniently describing, instead of limiting the disclosure.

Figure 5:
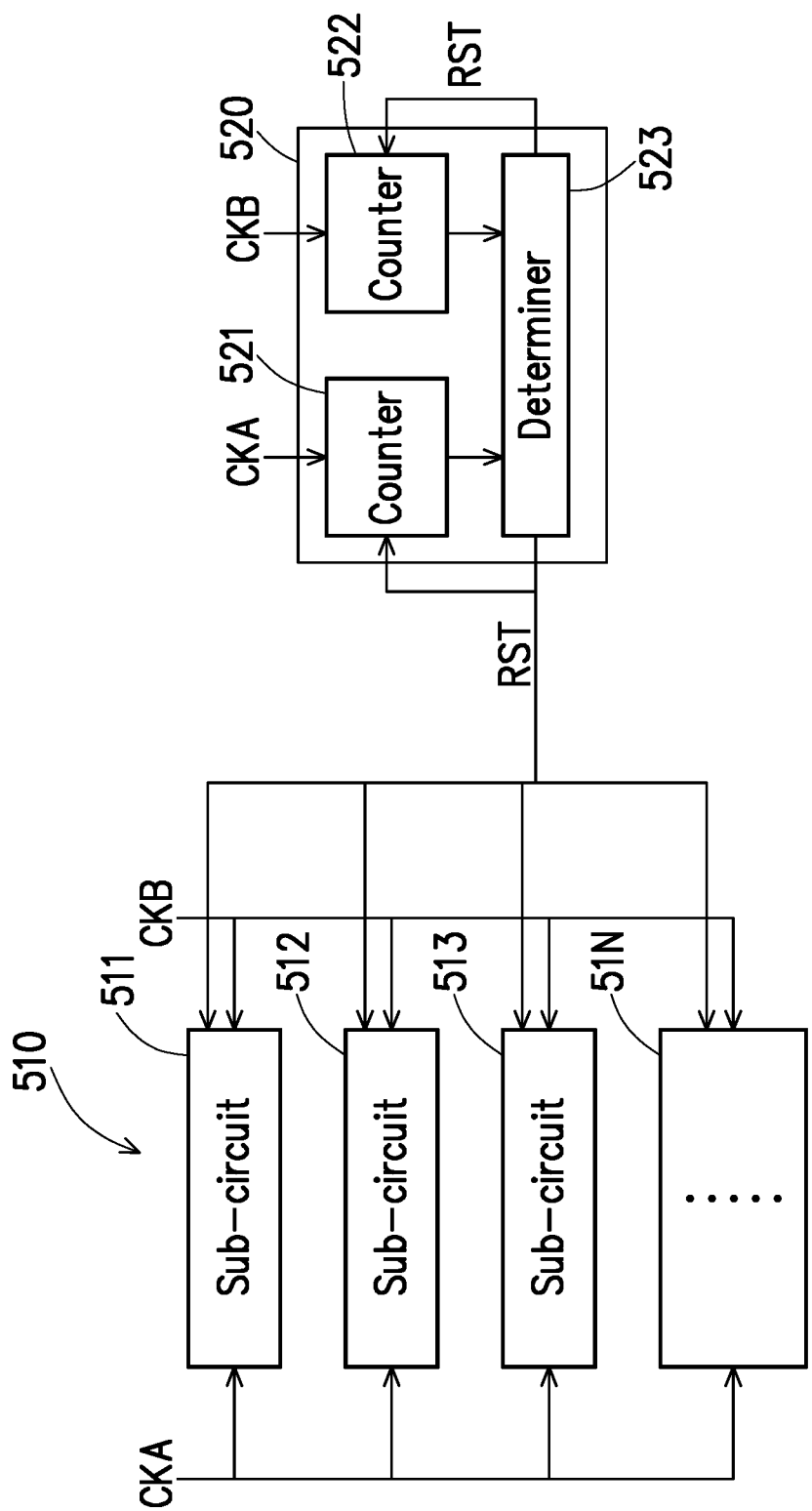
FIG. 5 is a schematic diagram showing an electronic device according to another embodiment of the disclosure.

Hereinafter, reference may be made to FIG. 5, which is a schematic diagram showing an electronic device according to another embodiment of the disclosure. An electronic device 500 includes a core circuit 510 and a detecting circuit 520. The core circuit 510 includes a plurality of sub-circuits 511 to 51N. Each of the sub-circuits 511 to 51N receives the clock signals CKA and CKB, and performs tasks based on the clock signals CKA and CKB. The detecting circuit 520 is coupled to the core circuit 510, and generates the reset signal RST through receiving the clock signals CKA and CKB and determining whether a frequency relationship between the clock signal CKA and the clock signal CKB is equal to an initial corresponding relationship.

Through counting the clock signals CKA and CKB and according to count values thereof respectively obtained, the detecting circuit 520 may determine the frequency relationship between the clock signal CKA and the clock signal CKB. The detecting circuit 520 includes counters 521, 522 and a determiner 523. The counters 521 and 522 respectively receive the clock signals CKA and CKB, and perform counting respectively based on the clock signals CKA and CKB to respectively generate a first count value and a second count value. Frequencies of the clock signals CKA and CKB may be proportional, and the proportion may be greater than 1, equal to 1, or less than 1. The determiner 523 may be a divider of a digital circuit, and determines a current frequency relationship between the clock signals CKA and CKB through a division between the first count value and the second count value. The determiner 523 also generates the reset signal RST through comparing the current frequency relationship with the initial corresponding relationship.

In this embodiment, the counters 521 and 522 may be implemented applying counters of digital circuits in any form without particular limitations.

According to the foregoing, in the embodiment of the disclosure, the electronic device detects the different working states in which the core circuit performs tasks according to the different clock signals, and performs the reset operation through detecting whether the relationship between these working states matches the predetermined corresponding relationship. In this way, when any clock signal is varied due to electromagnetic interference, resulting in an abnormal relationship between the working states of the core circuit, correction in real time is possible through the reset signal, and avoid malfunction of the electronic device due to electrostatic discharge or other types of external interference, maintaining the electronic device in normal function.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
a core circuit receiving a first clock signal and a second clock signal that are different, and generating a first working state and a second working state respectively according to the first clock signal and the second clock signal; and
a detecting circuit coupled to the core circuit, and detecting a relationship between the first working state and the second working state to generate a reset signal, wherein the reset signal is configured to reset the relationship between the first working state and the second working state to an initial corresponding relationship,
wherein the first working state and the second working state respectively corresponds to operations to a data buffer according to a first physical address and a second physical address,
wherein the initial corresponding relationship between the first physical address and the second physical address is that an address difference value between the first physical address and the second physical address is equal to a predetermined standard value.

2. The electronic device according to claim 1, wherein the core circuit comprises the data buffer, the data buffer obtains a data write point and a data read point respectively according to the first clock signal and the second clock signal, and performs data write according to the data write point and performs data read according to the data read point at the same time, wherein the data write point and the data read point respectively correspond to the first physical address and the second physical address of the data buffer, the detecting circuit generates the reset signal according to a comparison between the data write point and the data read point, and the detecting circuit provides the reset signal to reset the data write point and the data read point respectively to an initial data write point and an initial data read point.

3. The electronic device according to claim 2, wherein at a same time point, the detecting circuit determines whether the address difference value is equal to the predetermined standard value to generate the reset signal.

4. The electronic device according to claim 3, wherein at the same time point, when the address difference value is not equal to the predetermined standard value, the detecting circuit generates the reset signal.

5. The electronic device according to claim 3, wherein the detecting circuit comprises:
a storage device storing the predetermined standard value; and
a processor coupled to the storage device and the data buffer, and determining whether the address difference value is equal to the predetermined standard value to generate the reset signal.

6. The electronic device according to claim 2, wherein the core circuit comprises:
a first state machine circuit operating in the first working state according to the first clock signal; and
a second state machine circuit operating in the second working state according to the second clock signal,
wherein the detecting circuit detects whether the relationship between the first working state of the first state machine circuit and the second working state of the second state machine circuit at a same time point matches the initial corresponding relationship to generate the reset signal.

7. The electronic device according to claim 6, wherein at the same time point, in the first working state, the first state machine circuit performs data write on one of a plurality of registers of the second state machine circuit, and in the second working state, the second state machine circuit performs data read on another one of the plurality of registers of the second state machine circuit.

8. The electronic device according to claim 6, wherein the detecting circuit stores the initial corresponding relationship.

9. An electronic device, comprising:
a core circuit receiving a first clock signal and a second clock signal that are different, and generating a first working state and a second working state respectively according to the first clock signal and the second clock signal; and
a detecting circuit coupled to the core circuit, and detecting a relationship between the first working state and the second working state to generate a reset signal, wherein the reset signal is configured to reset the relationship between the first working state and the second working state to an initial corresponding relationship,
wherein the core circuit comprises a plurality of sub-circuits, and each of the plurality of sub-circuits receives the first clock signal and the second clock signal to operate,
wherein the detecting circuit determines whether a frequency relationship between the first clock signal and the second clock signal is equal to the initial corresponding relationship to generate the reset signal,
and the detecting circuit provides the reset signal to the plurality of sub-circuits to reset the plurality of sub-circuits.

10. The electronic device according to claim 8, wherein the detecting circuit comprises:
a first counter performing counting according to the first clock signal to generate a first count value;
a second counter performing counting according to the second clock signal to generate a second count value; and
a determiner coupled to the first counter and the second counter, obtaining a current frequency relationship between the first clock signal and the second clock signal according to the first count value and the second count value, and generating the reset signal through comparing the current frequency relationship and the initial corresponding relationship.

* * * * *